United States Patent
Kumst

(10) Patent No.: US 7,520,161 B2
(45) Date of Patent: Apr. 21, 2009

(54) TIGHTNESS TEST FOR DISK BOND CONNECTIONS AND TEST STRUCTURE FOR CARRYING OUT SAID METHOD

(75) Inventor: Ronald Kumst, Erfurt (DE)

(73) Assignee: X-FAB Semiconductor Foundries AG, Erfurt (DE)

( * ) Notice: Subject to any disclaimer, the term of this patent is extended or adjusted under 35 U.S.C. 154(b) by 164 days.

(21) Appl. No.: 10/591,686

(22) PCT Filed: Mar. 5, 2005

(86) PCT No.: PCT/EP2005/050993

§ 371 (c)(1),
(2), (4) Date: Sep. 5, 2006

(87) PCT Pub. No.: WO2005/085791

PCT Pub. Date: Sep. 15, 2005

(65) Prior Publication Data

US 2007/0196943 A1    Aug. 23, 2007

(30) Foreign Application Priority Data

Mar. 6, 2004    (DE) .................. 10 2004 011 035

(51) Int. Cl.
G01M 3/02 (2006.01)
(52) U.S. Cl. ......................................... 73/37
(58) Field of Classification Search ............. 73/37, 73/45.4, 49.2, 866.5, 52, 754; 257/48; 438/48
See application file for complete search history.

(56) References Cited

U.S. PATENT DOCUMENTS 5,837,935 A * 11/1998 Carper et al. ............ 174/50.51

(Continued)

FOREIGN PATENT DOCUMENTS

DE    197 39 961 C1    4/1999

(Continued)

OTHER PUBLICATIONS

Bergstrom, Paul L. et al.; "Thermally Driven Phase-Change Microactuation"; Journal of Microelectromechanical Systems; Mar. 1, 1995; pp. 10-17; vol. 4, No. 1; IEEE, Inc. New York.

(Continued)

Primary Examiner—Hezron Williams
Assistant Examiner—Gunnar J Gissel
(74) Attorney, Agent, or Firm—Stevens & Showalter LLP

(57) ABSTRACT

A process and a test structure for testing the hermeticity of bond connections are described. Points are provided on the wafer pair to be connected, at which hermetically closed cavities are additionally formed upon the connection of the wafers, e.g., as they are customary in microelectromechanical systems (MEMS). A pressure sensor structure and a structure are located in these cavities by means of which the internal pressure of the cavity can be changed from the outside, such as metal webs with narrowed cross-section which are built up in accordance with the principle of a fuse and, upon the generation of a current flow, melt or evaporate via the electrodes that lead towards the outside of the cavity. The chronological change of the changed internal pressure is tracked in a measuring fashion.

9 Claims, 2 Drawing Sheets

U.S. PATENT DOCUMENTS

| | | | |
|---|---|---|---|
| 6,106,735 A * | 8/2000 | Kurle et al. | 216/2 |
| 6,297,072 B1 * | 10/2001 | Tilmans et al. | 438/106 |
| 6,436,853 B2 * | 8/2002 | Lin et al. | 438/800 |
| 2003/0073292 A1 * | 4/2003 | Bartlett et al. | 438/458 |

FOREIGN PATENT DOCUMENTS

| | | |
|---|---|---|
| DE | 101 36 219 A1 | 2/2003 |
| EP | 0 794 558 A1 | 9/1997 |

OTHER PUBLICATIONS

Lapadatu, A. Cozma et al.; "A new concept for a self-testable pressure sensor based on the bimetal effect"; Sensors and Actuators; 2000; pp. 69-73; vol. 82; Elsevier Science S.A. ; Lausanne CH.

Nese, Martin et al.; "New method for testing hermeticity of silicon sensor structures"; Sensors and Actuators A; 1996; pp. 349-352; vol. 53; Elsevier Science S.A.

Waelti, M. et al.; "Package Quality Testing Using Integrated Pressure Sensor"; The International Journal of Microcircuits and Electronic Packaging; Jan. 1999; pp. 49-56; vol. 22, No. 1; International Microelectronics and Packaging Society; U.S.

* cited by examiner

TIGHTNESS TEST FOR DISK BOND CONNECTIONS AND TEST STRUCTURE FOR CARRYING OUT SAID METHOD

BACKGROUND OF THE INVENTION

The invention relates to a process and an arrangement for quality monitoring, i.e. a testing of the hermeticity of wafer bond connections as they are e.g. used for the production of MEMS (micoelectromechanical structures) by forming, for instance, glass and silicon wafers for producing hermetically tight cavities, in which the micromechanical sensor element is located. Such sensor elements require a high hermeticity of the cavity since the reliability and service life of the component depend to a high degree on the hermeticity of the wafer connection.

Normally, the procedure is such that in the elaboration of the bonding process by means of special control methods, e.g. by means of infrared microscopy, the hermeticity is tested and, depending on this, the process parameters are optimized. Leakages which may result in the current production operation, will only become apparent much later due to changes in data of the finished components. The discarding of the finished components, however, is a relative expensive process, since quite a number of very expensive and complex process steps had to be used for components which then no longer correspond to the required specifications.

Various processes for the testing of cavities in wafer bond connections have been described in the prior art, which, however, are only conditionally suitable for the testing of cavities under production conditions.

Nese et al., "New method for testing hermeticity of silicon sensor structures", A 53 (1996), pages 349 to 352, show e.g. a process for assessing semiconductor wafer bonding processes as regards the hermeticity, in which the gas concentration in the hermetically tight cavity of a test chip is measured by means of FTIR spectroscopy (Fourier transform infrared spectroscopy).

DE-B 197 39 961 describes a process for determining the gas pressure in a cavity with deformable walls of a semiconductor component, which is based on a resonance frequency measurement. Moreover, a process is known from DE-A 101 36 219, in which a capacity measurement of the test items immersed in a test liquid under defined conditions is implemented for testing the hermeticity of hermetically tight sensors, the test items having been previously subjected to a vacuum in special cases.

It is the object of the invention to indicate a technique for testing the hermeticity, which results in a safe result within a relative short period of time so that, thus, the testing of the hermeticity can also be used within the framework of a production control in wafer processes.

BRIEF SUMMARY OF THE INVENTION

Under a first aspect of the present invention the object is attained by means of a process for evaluating the hermeticity of wafer connections, the process comprising the production of a test structure. The test structure is formed on a base wafer by forming a micromechanical sensor structure and an adjacent melt structure with electric strip conductors and first contacting islands that are connected with the micromechanical sensor structure and second contacting islands that are connected with the melt structure, and, thus, a cavity is created by connecting a cover wafer with the base wafer in such a way that the micromechanical sensor structure and the melt structure are located in the cavity. Moreover, the process comprises the impressing of a current in the second contacting islands in order to cause the melt structure to melt for the purpose of the testing of the hermeticity of the cavity, whereby a change in pressure is generated in the inner area of the cavity which is measured as regards its chronological course by means of the micromechanical sensor structure.

Defective wafer connections can be recognized directly after the bonding process by means of this technique and thus can be excluded from the process at an early point in time. Due to this, manufacturing costs are saved and the long-term reliability of the components is increased. Since, moreover, the evaluation of the hermeticity generally takes place from the interior, environmental influences have no or only very little influence on the evaluation of the pressure of the cavity. Moreover, the expenditure as regards the test equipment can be kept relatively small.

In a further advantageous embodiment, the process also comprises the production of several microelectromechanical structures (MEMS) on the wafer connection.

Thus, in particular the hermeticity and/or reliability of the MEMS can also be determined very precisely during the production process, since the process parameters relating to the process of the production of the test structure substantially also influence the production of the MEMS structures in an identical fashion.

In a further advantageous embodiment, several test structures are produced at specific points of the wafer connection.

In this fashion, a very efficient process monitoring can be ensured which also reveals fluctuations of process parameters which have a very local effect across the surface of the wafer.

In a further embodiment the test structure to which the changed pressure is applied is specifically subjected to stress conditions, statements on the reliability being obtained by comparing the measuring values of the micromechanical sensor structure before and after the exerting of the stress condition.

The behavior of the test structure and thus also of other components and/or the property of the wafer connection as a whole can be evaluated due to the fact that they are acted upon in this fashion by a given load and/or stress so that, thus, statements on the future behavior of the test structure or other components are also possible. The predefined stress can e.g. also include the operation at certain temperature conditions, e.g. at increased or low temperatures, and/or the operation at certain moisture conditions and/or the operation at certain mechanical loads and the like. Thus, the ageing of the test structure and/or of other components that is to be expected can e.g. be concluded from the operation at increased temperatures and the behavior of the test structure recognized from this operation as regards changes in the hermeticity.

In a further embodiment the several test structures are arranged in accordance with predetermined criteria of quality monitoring for the microelectromechanical structures.

According to a further aspect of the present invention a process for monitoring a microelectromechanical structure is provided. The process comprises the production of a test structure according to a production process as it is described in the preceding embodiments. Moreover, the process comprises the production of the microelectromechanical structure so that it forms a functional connection with the test structure. Moreover, the microelectromechanical structure is operated and a current is impressed in the melt structure of the test structure. Finally, the measuring values of the micromechanical structure are evaluated in order to implement an online monitoring of the microelectromechanical structure.

Due to the formation of the test structure and the MEMS as a bond, the function of the MEMS can also be monitored during the phase of application after the singling of the components.

In a further embodiment the melt structure of the test structure comprises several rated melting points, the process also comprising: initiating a melting process of the several rated melting points in succession and evaluating of the measuring results obtained from the micromechanical sensor structure in order to implement an online monitoring.

Thus, online monitoring can be made more flexible so that measuring values can be obtained in different points in time. Moreover, the test structure can also already be used during the production phase of the bond for ascertaining measuring data.

According to a further aspect of the present invention a test structure is provided for testing the hermeticity of wafer bond connections. The test structure comprises an area of a base wafer, an area of a cover wafer and a cavity that is formed by the wafer connection of the base wafer and cover wafer. Moreover, the test structure comprises a pressure-sensitive micromechanical structure that is disposed in the cavity (5) and a melt structure that is disposed in the cavity. Moreover, the test structure comprises first contacting islands which are located outside the cavity and are connected with the pressure-sensitive micromechanical structure and second contacting islands that are disposed outside the cavity and are connected with the melt structure. Moreover, strip conductors are provided in the test structure which form a connection from the melt structure to the second contacting islands and from the pressure-sensitive micromechanical structure to the first contacting islands.

The hermeticity behavior of the test structure itself that is formed by wafer bonding processes and the hermeticity and thus the component behavior of further components which were possibly produced together with the test structure using the same process parameters can be evaluated due to this construction of the test structure.

In a further advantageous embodiment the melt structure has a rated melting point. Thus, defined conditions during melting and evaporating of the material of the rated melting point can be achieved.

In a further embodiment several melting points are provided in the melt structure, the melting points being defined by the design of the structure, due to which the melting process can be successively repeated in a limited number.

It is possible with such an arrangement to cause more than one pressure changing process in the test structure so that more detailed examinations are possible. Thus, the various phases of the production process can e.g. be tested since corresponding hermeticity tests can be implemented several times in a chronological sequence.

Moreover, the providing of several rated melting points makes an efficient online monitoring of the test structure and, thus, possibly also of other MEMS structures which are present in a wafer bond therewith, since hermeticity tests can be implemented during various operating phases of the test structure and/or MEMS structures that are allocated thereto. Moreover, the possibility is offered to examine the test structure several times under respectively different stress conditions so that a very detailed testing can be locally implemented on the same chip surface.

In a further advantageous embodiment the melt structure is made up of metal and the elements melting during current flow in the inner area extend in a meandering fashion.

An extremely compact structure that is efficient as regards manufacturing technique results due to this setup.

In a further embodiment the metal of the melt structure comprises aluminum.

According to a further aspect of the invention, a wafer connection is provided which comprises a microelectromechanical structure (MEMS) and a test structure for evaluating the hermeticity of the wafer connection which is built up in such a way as it is described in the preceding embodiments.

In a further embodiment several test structures and several microelectromechanical structures are provided.

In this fashion, the measuring data can be obtained very efficiently prior to the singling of the components as this was already described.

In a further embodiment the several test structures are disposed in accordance with the criteria for quality assurance of the several microelectromechanical structures.

In a further embodiment the test structure and the microelectromechanical structure are disposed as a bond. Due to this, the bond is a functional unit after the singling of the components and permits an online monitoring.

Further advantageous embodiments, features and advantages are also revealed by the following detailed description and the appended patent claims.

BRIEF DESCRIPTION OF THE SEVERAL VIEWS OF THE DRAWINGS

In the following detailed description of further illustrative embodiments reference is made to the drawings which form a component of the description, wherein.

DETAILED DESCRIPTION OF THE INVENTION

Figure 1:
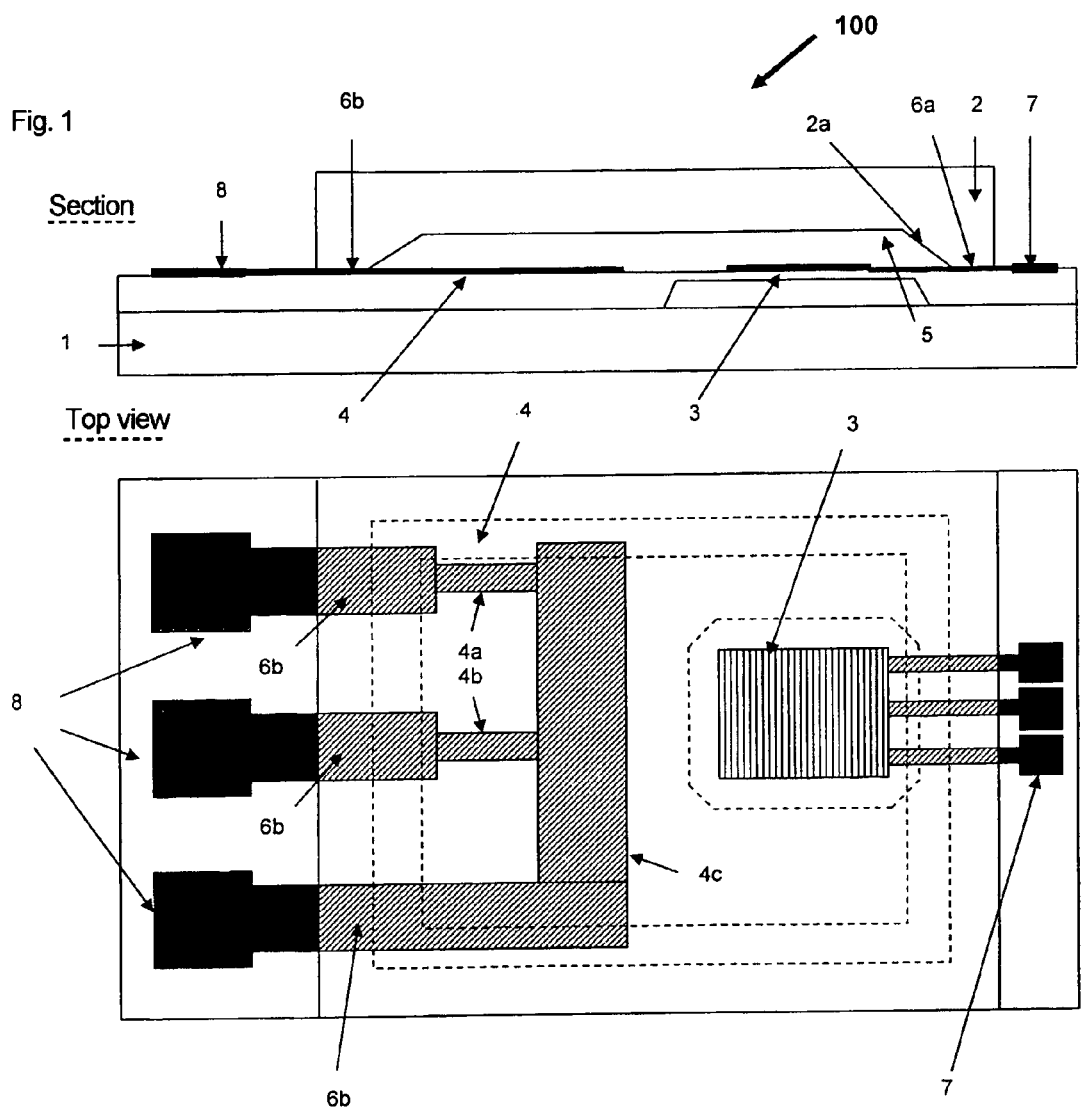
FIG. 1 shows a sectional view and a top view of a wafer connection with a test structure, and FIG. 2 schematically shows a top view of a wafer connection with several test structures and several microelectromechanical structures (MEMS).

FIG. 1 schematically shows the cross-section of the setup of a test structure 100 in the upper part of the picture. The test structure 100 comprises a base wafer 1 and/or a region thereof, which may be provided e.g. in the form of a silicon wafer, a glass wafer or another suitable support. Moreover, a cover wafer 2 and/or a region thereof with recesses 2a above the base wafer 1 is disposed in such a way that a cavity 5 is formed. A pressure-sensitive sensor structure 3 is disposed in the cavity 5, which is connected with corresponding contacting islands 7 by means of strip conductors 6a. The strip conductors 6a are designed in such a way that they form an electrical connection from the contacting islands 7 located outside the cavity 5 to the pressure-sensitive sensor structure 3, the hermetic tightness of the cavity 5 being substantially preserved. Moreover, the test structure 100 comprises a melt structure 4 which comprises one or several rated melting points. In the top view of the structure 100 which is represented in the lower part of FIG. 1 the melt structure 5 is shown with two rated melting points 4a, 4b, it being possible to provide one or more than two rated melting points 4a, 4b in other embodiments. The melt structure 4 is made up of metal in an advantageous embodiment, e.g. aluminium, so that, here, the well-proven metallization processes can be used when producing the structure 4, which are known in the art of semiconductor technology. Moreover, the conductor extension in the rated melting points 4a, 4b can be provided in a meander-like fashion. The rated melting points 4a, 4b are connected with corresponding contacting islands 8 via a common electrode 4c and several strip conductors 6b.

In the represented embodiment the rated melting points 4a, 4b may be optionally activated individually or jointly by applying a suitable voltage between the contacting island 8 that is directly connected with the common electrode 4c and the contacting islands 8 that are directly connected with the corresponding rated melting points 4a, 4b. As in the pressure-sensitive sensor structure 3, the strip conductors 6b form a connection between the contacting islands 8 and the rated melting points 4a, 4b and the counter-electrode 4c in such a way that the hermeticity of the cavity 5 is substantially preserved.

In the production of the test structure 100 the cavity 5 is created upon the connection of the base wafer 1 with the cover wafer 2, in which the melt structure 4 and the pressure-sensitive structure 3 are then jointly disposed, the latter having been previously formed on the base wafer 1 by means of manufacturing processes known from semiconductor technology. The test structures 100 may be provided on the base wafer 1 in numerous forms, it being possible that the number and the position of the test structures 100 are e.g. selected on the basis of the principles of quality control, if the test structures 100 are to be used for quality monitoring during the production of the wafer bond structures, which contain corresponding MEMS structures which also have a cavity whose hermeticity must be checked.

Figure 2:
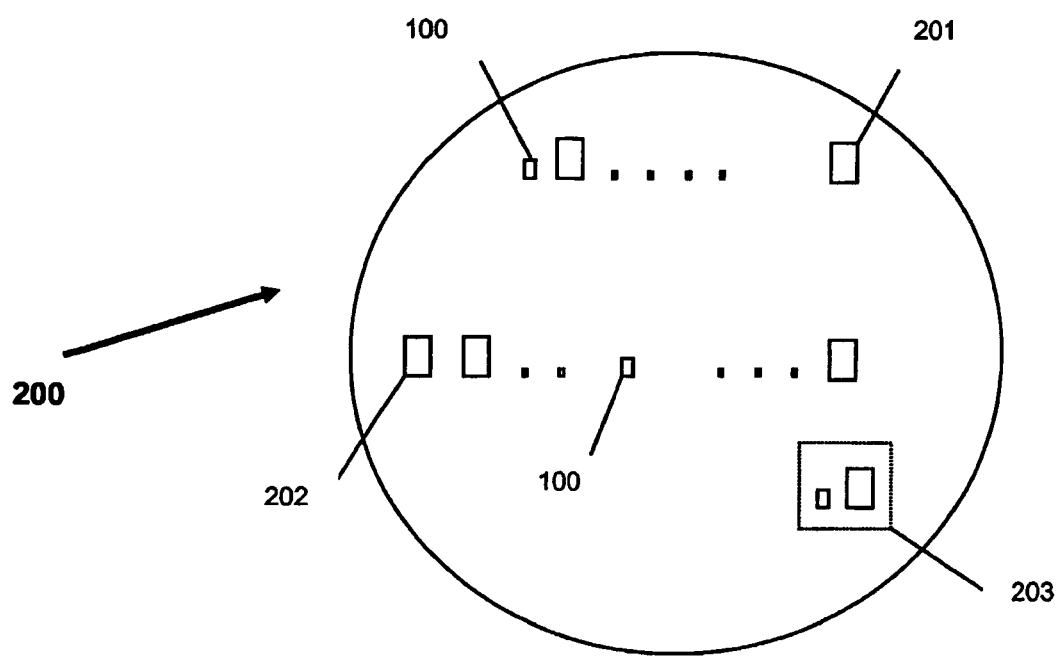

FIG. 2 shows schematically a top view of a typical wafer connection and/or composite semiconductor wafer 200 as it may be used for manufacturing MEMS structures and test structures of the present invention. Here, several test structures 100 are arranged in a distributed fashion across the wafer 200 in order to be able to possibly ascertain local fluctuations of the entire manufacturing process for the wafer 200. In the represented embodiment one or several MEMS structures 201 are also provided which may also have a cavity similar to the cavity 5 of FIG. 1, in which a micromechanical sensor element may be arranged. In the represented embodiment a wafer bond 203 of a test structure 100 and an MEMS 201 is shown so that, upon a singling the individual functional elements of the wafer 200, a test structure 100 together with an MEMS 201 is e.g. obtained as a functional unit. In other applications, the test structures 100 are distributed in view of the available chip surface and a statistic relevance of corresponding measuring results that is as high as possible. Moreover, the wafer 200 may only have test structures 100 or jointly test structures 100 and MEMS 201, the test structures being individually provided upon singling so that they can then be provided for further intended purposes.

As already mentioned above, fluctuations in the process parameters may occur in the manufacture of the test structure 100 and/or the MEMS 201, which may impair the manufacturing process. Moreover, the importance and/or influence of the individual process parameters can possibly not be exactly predicted in the development of corresponding manufacturing processes so that an evaluation of the component condition during certain manufacturing phases can provide information about the importance of individual process parameters. In other fields of application, for instance, if the test structure 100 is formed as a bond 203 with MEMS 201 as a functional unit, the status of the functional unit and, thus, of the MEMS 201 can be ascertained by means of measuring data which can be obtained by the operation of the test structure 100. Thus, an online monitoring of the MEMS 201 can in particular be achieved.

During the operation of the test structure a suitable current is impressed through selected strip conductors 6b of the melt structure 4 so that the correspondingly activated rated melt point 4a, 4b melts and evaporates. For instance, a corresponding current flow through the rated melt point 4a may occur in the embodiment shown in the bottom part of FIG. 1 by applying a voltage to the uppermost and the lowermost contacting island 8. In this connection, electrical signals can be obtained before and/or during and after the fusing of the corresponding rated melt point 4a, 4b via the contacting islands 7, which represent the pressure in the interior of the cavity 5, the course of the pressure that changes due to the melting and/or evaporation process providing information on the hermeticity of the cavity 5. I.e. the chronological course of the measured pressure values provides information on the hermeticity of the wafer connection. Thus, after the completion of a specific production phase in which the test structure 100 is already operational, the quality of the hermeticity of the cavity 5 can e.g. be evaluated, from which a conclusion can be drawn as regards the hermeticity of the corresponding cavities in the MEMS 201. Here, the distribution of the test structures 100 on the wafer, e.g. the wafer 200, can take place in such a way that the principles of manufacturing control are taken into account, if the process is used for quality monitoring in MEMS wafer manufacture. Moreover, the test structure 100 can also be used as a singled element or it can be used together with the MEMS 201 as a bond so that it can e.g. serve for so-called online monitoring in the case of the parallel use in safety-relevant MEMS components.

When operating the test structure 100, if several rated melt points 4a, 4b are provided in it, they can be caused to melt simultaneously or selectively. In one mode of operation the rated melt points 4a, 4b of FIG. 1 can e.g. be caused to melt successively as regards time so that the corresponding measuring results can be ascertained at different points in time. In this fashion, both an efficient online monitoring of MEMS components can be implemented and a very efficient monitoring of the manufacturing process and an evaluation of the reliability of the wafer connection can be achieved. For this purpose, the test structure 100 may be subjected to a stress test, in which predetermined stress conditions are adjusted in order to examine the corresponding impacts on the behavior of the test structure 100 and thus possibly on the MEMS 201. The test structure 100 can, for instance, be used for evaluating the hermeticity of the cavity 5 by using the rated melt point 4a in a first predetermined condition, from which further information on the reliability of the test structure 100 and thus the wafer connection 200 can be obtained. After this, the predetermined stress conditions can be exerted, the wafer can e.g. be operated and/or held at high or low temperatures, at high or low humidity, while mechanical forces act on it. During or after such an impact of a predetermined stress situation, the test structure 100 can again be operated by means of the rated melting point 4b in order to thus ascertain a corresponding influence of the stress situation on the reliability of the test structure 100 and thus the wafer connection 200 and/or the MEMS 201. Such stress examinations can, of course, also be carried out with a single rated melting point.

With reference to FIG. 1 further embodiments will be described now. A process for evaluating the hermeticity of wafer connections, in particular during the bonding of wafers for the production of microelectromechanical structures (MEMS), in which the micromechanical sensor element is located in a hermetically sealed cavity 5, is also distinguished by the fact that, distributed on the wafer surface at specific points, in addition to the MEMS, micromechanical sensor structures 3 and, adjacent to them, melt structures 4 with electric strip conductors 6 and contacting islands 7 and 8 that are located outside the cavity are produced in such a fashion that in each case a micromechanical sensor 3 and a melt structure 4 are located in one and the same cavity 5 after the wafer connection with the cover wafer 2 forming the cavities for the MEMS and the test structure, that after the wafer connection process for the purpose of the hermeticity test the melt structure 4 is caused to melt via the electrical external contacts 8 by means of a current, whereby a change in pressure is produced in the interior of the cavity 5, which is measured by means of the sensor structure 3 in its chronological course.

Moreover, the test structure that is under the changed pressure is specifically stressed (temperature/humidity/mechanically etc.) and information on the reliability is obtained by means of a comparison of the measuring values of the pressure-sensitive structure 3 prior to and after the stress.

A test structure that works according to the preceding process is distinguished by the fact that the melt structure 4 consists of metal and the parts melting during a current extend in a meander-like fashion in the interior 5.

Moreover, the test structure consists of aluminum in one embodiment.

Moreover, several melting points are present in the melt structure in one embodiment, the rated melting points being defined by the design of the structure, whereby a limited number of melting processes must be successively repeated.

I claim:

1. A process for evaluating the hermeticity of a wafer connection, the process comprising:
   manufacturing a test structure by:
      forming a micromechanical sensor structure and an adjacent melt structure with electric strip conductors and first contacting islands which are connected with the micromechanical sensor structure and second contacting islands which are connected with the melt structure on a base wafer, and
      creating a cavity by connecting a cover wafer with the base wafer so that the micromechanical sensor structure and the melt structure are located in the cavity; and
   impressing a current into the second contacting islands in order to cause the melt structure to melt for the purpose of the hermeticity test of the cavity, whereby a change in pressure is generated in the interior of the cavity, the change in pressure having a chronological course and being measured with the micromechanical sensor structure to obtain measuring values, wherein the test structure being under the generated pressure change is subjected to a stress condition and wherein information on a reliability is obtained by comparing the measuring values of the micromechanical sensor structure before and after the exertion of the stress condition.

2. The process according to claim 1, further comprising manufacturing several microelectromechanical structures on the wafer connection.

3. The process according to claim 2, wherein several test structures are produced at specific points of the wafer connection.

4. The process according to claim 3, wherein the several test structures are disposed in accordance with predetermined criteria of quality monitoring for the microelectromechanical structures.

5. A process for monitoring the function of a microelectromechanical structure, the process comprising:
   manufacturing a test structure by:
      forming a micromechanical sensor structure and an adjacent melt structure with electric strip conductors and first contacting islands which are connected with the micromechanical sensor structure and second contacting islands which are connected with the melt structure on a base wafer, wherein the melt structure has several rated melting points successively activated by a melting process; and
      creating a cavity by connecting a cover wafer with the base wafer so that the micromechanical sensor structure and the melt structure are located in the cavity;
   manufacturing the microelectromechanical structure so that it forms a functional bond with the test structure;
   operating the microelectromechanical structure;
   impressing a current into the melt structure of the test structure;
   providing measuring values of the micromechanical sensor structure in order to implement measuring results for an online monitoring of the microelectromechanical structure; and
   evaluating the measuring results obtained from the micromechanical sensor structure in order to implement the online monitoring of the microelectromechanical structure.

6. A test structure for evaluating the hermeticity of wafer connections comprising:
   an area of a base wafer and an area of a cover wafer,
   a cavity formed by a wafer connection of the base wafer and the cover wafer,
   a pressure-sensitive micromechanical structure disposed in the cavity,
   a melt structure disposed in the cavity, wherein several rated melting points are provided in the melt structure, the rated melting points defined by a design of the melt structure for allowing a limited number of melting processes to be successively repeated,
   first contacting islands located outside the cavity and connected with the pressure-sensitive micromechanical structure,
   second contacting islands disposed outside the cavity and connected with the melt structure, and
   strip conductors that form a connection from the melt structure to the second contacting islands and from the pressure-sensitive micromechanical structure to the first contacting islands.

7. The test structure according to claim 6, wherein the melt structure is composed of metal.

8. The test structure according to claim 7, wherein the metal contains aluminum.

9. The test structure according to claim 6 wherein melting parts of the melt structure extend in a meander-like fashion in the cavity during a current flow.

* * * * *